(12) United States Patent
Oka

(10) Patent No.: US 9,660,162 B2
(45) Date of Patent: May 23, 2017

(54) ILLUMINATION DEVICE

(71) Applicant: NICHIA CORPORATION, Anan-shi, Tokushima (JP)

(72) Inventor: Yuta Oka, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/657,474

(22) Filed: Mar. 13, 2015

(65) Prior Publication Data
US 2015/0263250 A1 Sep. 17, 2015

(30) Foreign Application Priority Data

Mar. 14, 2014 (JP) ................. 2014-051577

(51) Int. Cl.
H01L 23/48 (2006.01)
H01L 33/62 (2010.01)
H05K 1/11 (2006.01)
H01L 33/48 (2010.01)
H05K 3/34 (2006.01)

(52) U.S. Cl.
CPC ............. *H01L 33/62* (2013.01); *H05K 1/111* (2013.01); *H01L 33/486* (2013.01); *H05K 3/3436* (2013.01); *H05K 2201/0939* (2013.01); *H05K 2201/09418* (2013.01); *H05K 2201/09427* (2013.01); *H05K 2201/09663* (2013.01); *H05K 2201/09954* (2013.01); *H05K 2203/048* (2013.01); *Y02P 70/611* (2015.11)

(58) Field of Classification Search
CPC .... H01L 23/48; H01L 23/49822; H01L 33/62
See application file for complete search history.

(56) References Cited

U.S. PATENT DOCUMENTS

| | | | |
|---|---|---|---|
| 2005/0056772 A1* | 3/2005 | Kaneko | H01S 5/18388 250/214.1 |
| 2012/0181569 A1* | 7/2012 | Choi | H01L 33/62 257/99 |
| 2013/0187182 A1* | 7/2013 | Muramatsu | H01L 33/60 257/98 |
| 2013/0248894 A1* | 9/2013 | Nakamura | H01L 33/486 257/88 |

(Continued)

FOREIGN PATENT DOCUMENTS

| | | |
|---|---|---|
| JP | 10-209496 A | 8/1998 |
| JP | 2002-076602 A | 3/2002 |

(Continued)

*Primary Examiner* — Jae Lee
(74) *Attorney, Agent, or Firm* — Squire Patton Boggs (US) LLP

(57) ABSTRACT

Provided is an illumination device that includes a light emitting device having a first electrode and a second electrode and a mounting substrate including a first wiring pattern and a second wiring pattern. The first wiring pattern and the second wiring pattern face and are bonded to the first electrode and the second electrode, respectively, through a bonding material. The second electrode and the second wiring pattern are configured to be at least partially overlapped with each other in a plan view irrespective of an orientation of the light emitting device, under condition that the first electrode and the first wiring pattern are at least partially overlapped with each other in the plan view.

18 Claims, 10 Drawing Sheets

(56) References Cited

U.S. PATENT DOCUMENTS

2014/0175471 A1* 6/2014 Akimoto ............... H01L 27/156
                                                    257/91
2014/0264266 A1* 9/2014 Li ......................... H01L 33/486
                                                    257/13
2015/0021626 A1* 1/2015 Nakamura ............. H01L 33/38
                                                    257/79

FOREIGN PATENT DOCUMENTS

| JP | 2006-128202 A | 5/2006 |
| JP | 2006-332492 A | 12/2006 |
| JP | 2008-270728 A | 11/2008 |

* cited by examiner

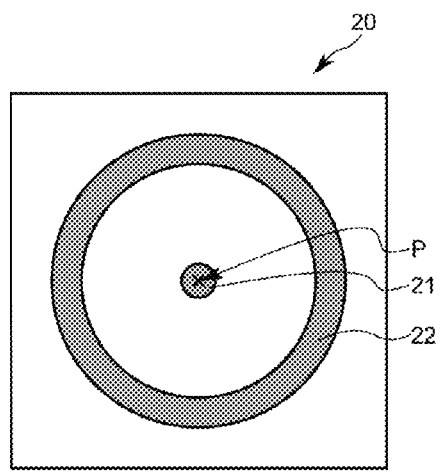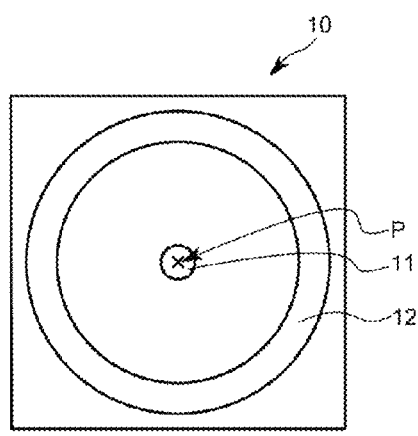
FIG. 1A    FIG. 1B
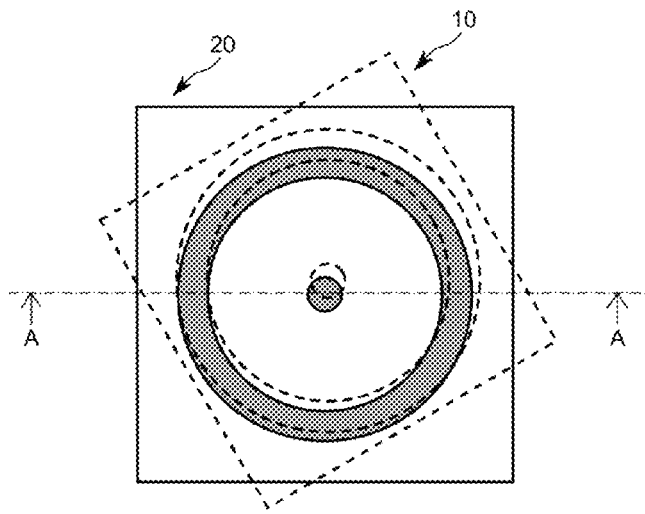
FIG. 1C
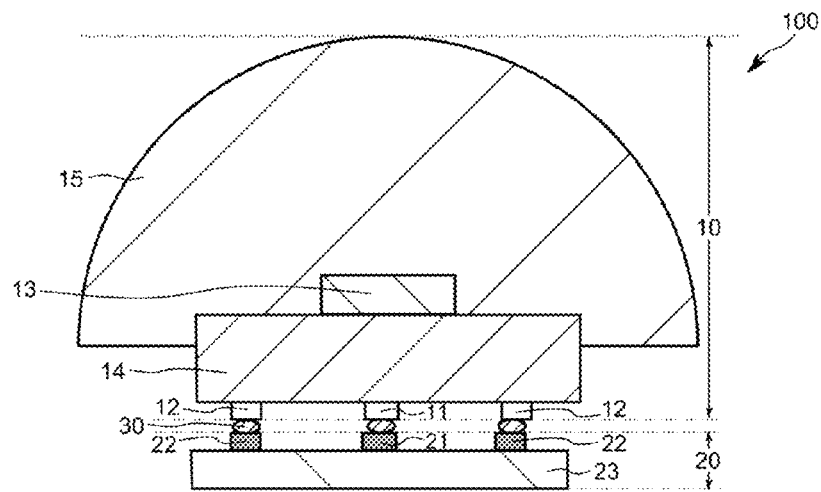
FIG. 1D

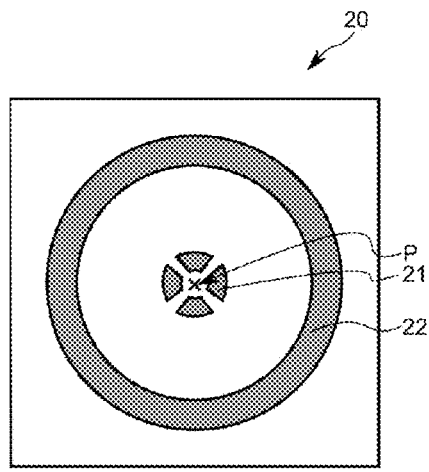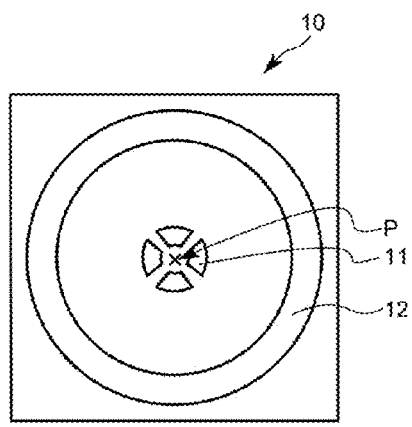
FIG. 4A  FIG. 4B
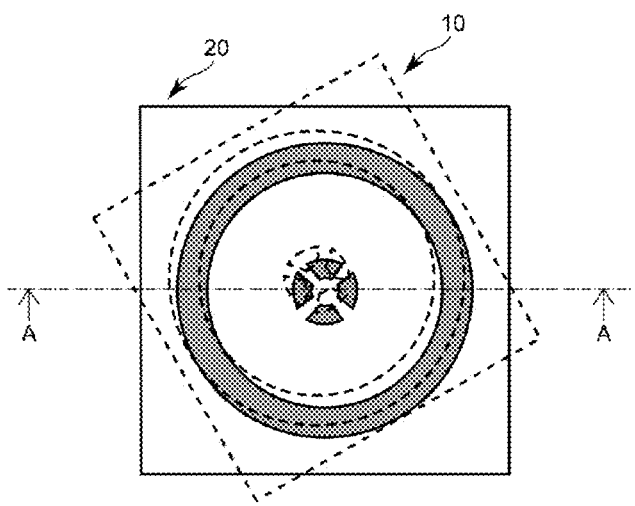
FIG. 4C
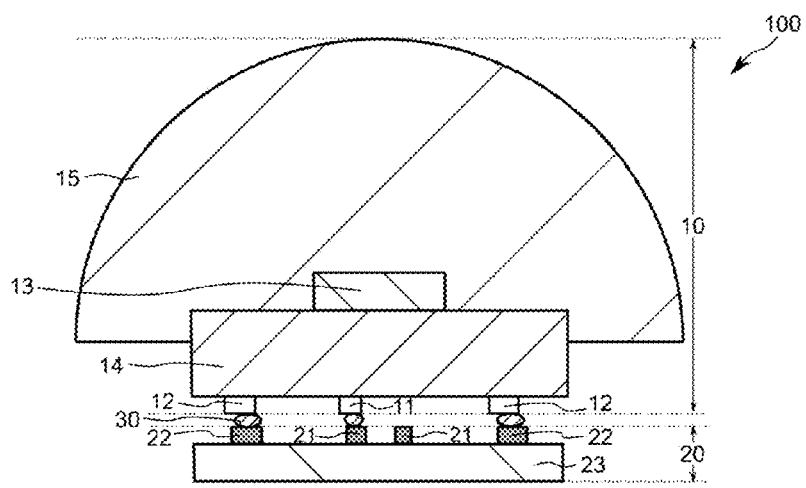
FIG. 4D

ILLUMINATION DEVICE

CROSS REFERENCE TO RELATED APPLICATIONS

This application claims the benefit of Japanese Priority Patent Application JP2014-051577 filed on Mar. 14, 2014, the entire contents of which are incorporated herein by reference.

BACKGROUND

The disclosure relates to an illumination device.

There has been proposed an illumination device in which a first electrode and a second electrode of a light emitting device are bonded to a first wiring pattern and a second wiring pattern of a mounting substrate so as to face the first wiring pattern and the second wiring pattern, respectively, through a bonding material, as disclosed in Japanese Unexamined Patent Application Publication No. 2008-270728.

SUMMARY

In a conventional illumination device as described above, electrodes of a light emitting device may fail to be bonded to respective wiring patterns of a mounting substrate when the light emitting device is placed on the mounting substrate in an orientation different from a predetermined orientation.

It is desirable to provide an illumination device capable of bonding electrodes of a light emitting device and wiring patterns of a mounting substrate together irrespective of an orientation in which the light emitting device is placed. One non-limiting example of the illumination device may be an illumination device that includes a light emitting device having a first electrode and a second electrode and a mounting substrate including a first wiring pattern and a second wiring pattern. The first wiring pattern and the second wiring pattern face and are bonded to the first electrode and the second electrode, respectively, through a bonding material. The second electrode and the second wiring pattern are configured to be at least partially overlapped with each other in a plan view irrespective of an orientation of the light emitting device, under condition that the first electrode and the first wiring pattern are at least partially overlapped with each other in the plan view.

The illumination device according to an embodiment makes it possible to bond the electrodes of the light emitting device and the wiring patterns of the mounting substrate together irrespective of an orientation in which the light emitting device is placed. Hence, it is possible to suppress a decrease in yield attributed to a bonding failure, and thereby to improve productivity in manufacturing the illumination device.

It is to be understood that both the foregoing general description and the following detailed description are exemplary, and are intended to provide further explanation of the technology as claimed. Also, effects of the technology are not limited to those described above. Effects achieved by the technology may be those that are different from the above-described effects, or may include other effects in addition to those described above.

BRIEF DESCRIPTION OF THE DRAWINGS

FIGS. 1A to 1D are schematic views for describing an illumination device according to a first embodiment, wherein FIG. 1A is a top view of a mounting substrate, FIG. 1B is a bottom view of a light emitting device, FIG. 1C is a plan view in which the light emitting device is placed on the mounting substrate and the mounting substrate and the light emitting device are denoted by a solid line and a broken line, respectively, and FIG. 1D is a cross-sectional view taken along a line A-A in FIG. 1C.

FIGS. 2A to 2D are schematic views for describing the illumination device according to the first embodiment, wherein FIG. 2A is a top view of the mounting substrate, FIG. 2B is a bottom view of the light emitting device, FIG. 2C is a plan view in which the light emitting device is placed on the mounting substrate and the mounting substrate and the light emitting device are denoted by a solid line and a broken line, respectively, and FIG. 2D is a cross-sectional view taken along a line A-A in FIG. 2C.

FIGS. 3A to 3D are schematic views for describing the illumination device according to the first embodiment, wherein FIG. 3A is a top view of the mounting substrate, FIG. 3B is a bottom view of the light emitting device, FIG. 3C is a plan view in which the light emitting device is placed on the mounting substrate and the mounting substrate and the light emitting device are denoted by a solid line and a broken line, respectively, and FIG. 3D is a cross-sectional view taken along a line A-A in FIG. 3C.

FIGS. 4A to 4D are schematic views for describing the illumination device according to the first embodiment, wherein FIG. 4A is a top view of the mounting substrate, FIG. 4B is a bottom view of the light emitting device, FIG. 4C is a plan view in which the light emitting device is placed on the mounting substrate and the mounting substrate and the light emitting device are denoted by a solid line and a broken line, respectively, and FIG. 4D is a cross-sectional view taken along a line A-A in FIG. 4C.

FIGS. 5A to 5D are schematic views for describing an illumination device according to a second embodiment, wherein FIG. 5A is a top view of the mounting substrate, FIG. 5B is a bottom view of the light emitting device, FIG. 5C is a plan view in which the light emitting device is placed on the mounting substrate and the mounting substrate and the light emitting device are denoted by a solid line and a broken line, respectively, and FIG. 5D is a cross-sectional view taken along a line A-A in FIG. 5C.

FIGS. 6A to 6D are schematic views for describing an illumination device according to a third embodiment, wherein FIG. 6A is a top view of the mounting substrate, FIG. 6B is a bottom view of the light emitting device, FIG. 6C is a plan view in which the light emitting device is placed on the mounting substrate and the mounting substrate and the light emitting device are denoted by a solid line and a broken line, respectively, and FIG. 6D is a cross-sectional view taken along a line A-A in FIG. 6C.

FIGS. 7A to 7D are schematic views for describing an illumination device according to a fourth embodiment, wherein FIG. 7A is a top view of the mounting substrate, FIG. 7B is a bottom view of the light emitting device, FIG. 7C is a plan view in which the light emitting device is placed on the mounting substrate and the mounting substrate and the light emitting device are denoted by a solid line and a broken line, respectively, and FIG. 7D is a cross-sectional view taken along a line A-A in FIG. 7C.

FIGS. 8A to 8D are schematic views for describing the illumination device according to the fourth embodiment, wherein FIG. 8A is a top view of the mounting substrate, FIG. 8B is a bottom view of the light emitting device, FIG. 8C is a plan view in which the light emitting device is placed on the mounting substrate and the mounting substrate and the light emitting device are denoted by a solid line and a broken line, respectively, and FIG. 8D is a cross-sectional view taken along a line A-A in FIG. 8C.

FIGS. 9A to 9D are schematic views for describing the illumination device according to the fourth embodiment, wherein FIG. 9A is a top view of the mounting substrate, FIG. 9B is a bottom view of the light emitting device, FIG. 9C is a plan view in which the light emitting device is placed on the mounting substrate and the mounting substrate and the light emitting device are denoted by a solid line and a broken line, respectively, and FIG. 9D is a cross-sectional view taken along a line A-A in FIG. 9C.

FIGS. 10A and 10B describe a principle of a self-alignment effect, wherein FIG. 10(A) illustrates an example of a state before the self-alignment effect is exerted and FIG. 10(B) illustrates an example of a state after the self-alignment effect is exerted.

DETAILED DESCRIPTION

Figure 2A:
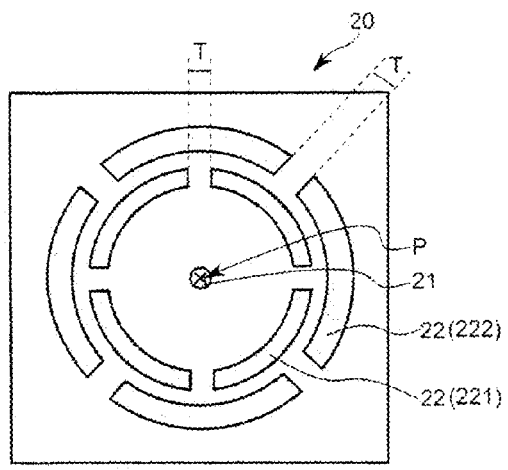
Figure 2B:
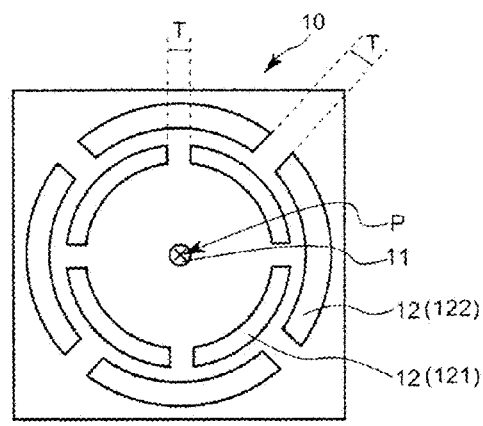
Figure 2C:
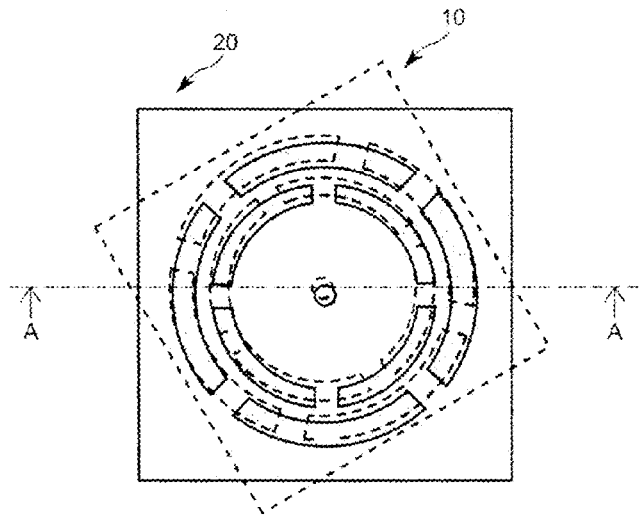
Figure 2D:
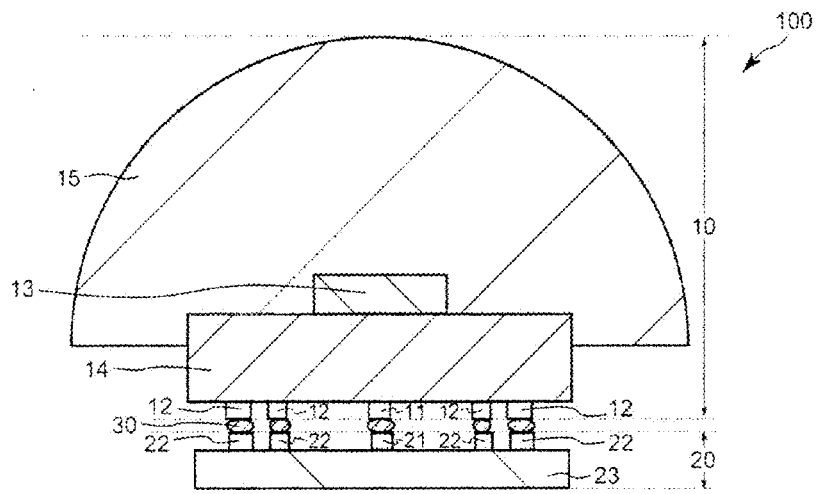
Figure 3A:
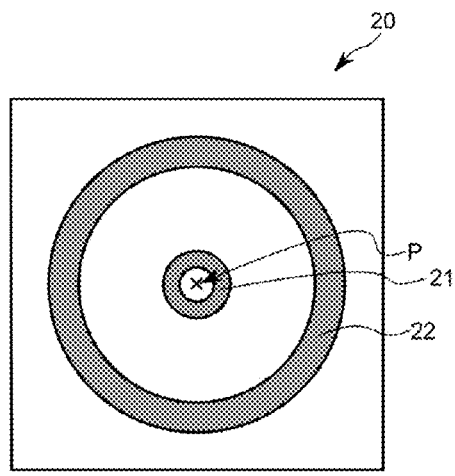
Figure 3B:
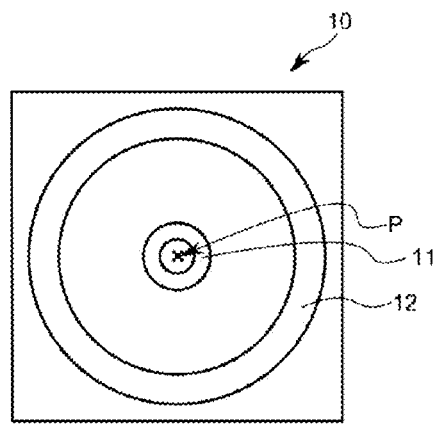
Figure 3C:
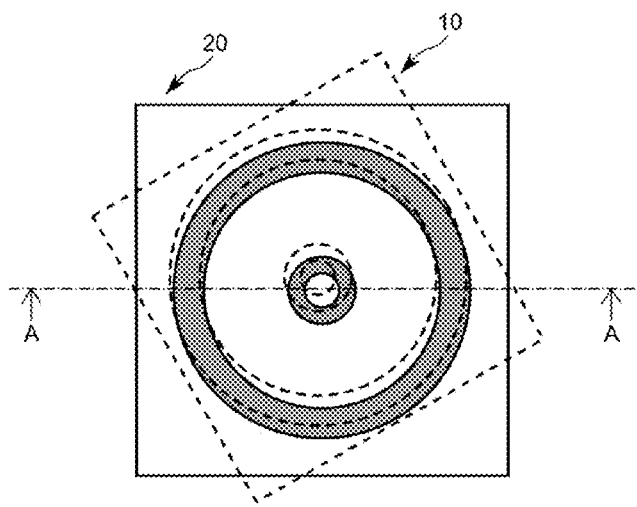
Figure 3D:
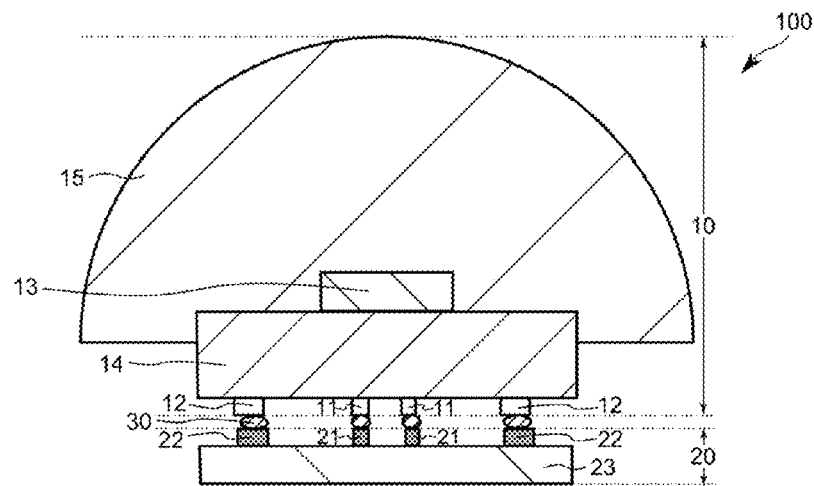

FIGS. 1A to 4D are schematic views for describing an illumination device according to a first embodiment. FIGS. 1A, 2A, 3A, and 4A are each a top view of a mounting substrate. FIGS. 1B, 2B, 3B, and 4B are each a bottom view of a light emitting device. FIGS. 1C, 2C, 3C, and 4C are each a plan view, in which the light emitting device is placed on the mounting substrate, and the mounting substrate and the light emitting device are denoted by a solid line and a broken line, respectively. FIGS. 1D, 2D, 3D, and 4D are cross-sectional views taken along respective lines A-A in FIGS. 1C, 2C, 3C, and 4C.

Referring to FIGS. 1A to 4D, an illumination device 100 according to the first embodiment includes a light emitting device 10 having a first electrode 11 and a second electrode 12 and a mounting substrate 20 including a first wiring pattern 21 and a second wiring pattern 22. The first wiring pattern 21 and the second wiring pattern 22 face and are bonded to the first electrode 11 and the second electrode 12, respectively, through a bonding material 30. The second electrode 12 and the second wiring pattern 22 are configured to be at least partially overlapped with each other in a plan view irrespective of an orientation of the light emitting device 10, under condition that the first electrode 11 and the first wiring pattern 21 are at least partially overlapped with each other in the plan view.

In the following, some features of the illumination device 100 are described in order.

The light emitting device 10 may include a light emitting element 13, the first electrode 11, and the second electrode 12. The light emitting device 10 may also include a package 14 on which the light emitting element 13 is mounted, and a covering member 15 that seals the light emitting element 13. For example, the first electrode 11 of the light emitting device 10 may be an n-side external electrode provided on a lower surface of the package 14, and the second electrode 12 of the light emitting device 10 may be a p-side external electrode provided on the lower surface of the package 14. The first electrode 11 and the second electrode 12 of the light emitting device 10 may be provided on the mounting surface side (provided on the lower surface of the package 14 in the first embodiment) of the light emitting device 10. The first electrode 11 and the second electrode 12 may be electrically connected, through respective metal members, to an n-side electrode and a p-side electrode of the light emitting element 13 provided on the upper surface side of the package 14, respectively. The metal member may be, for example but not limited to, a lead frame, a through hole, or the like.

The light emitting element 13 may be, for example but not limited to, a light emitting diode chip, a laser diode chip, or the like. The light emitting element 13 may include a sapphire substrate, an n-type semiconductor layer, a light emitting layer, a p-type semiconductor layer, etc., for example. The n-type semiconductor layer may have a thickness in a range from about 1 μm to about 2 μm, the light emitting layer may have a thickness in a range from about 50 nm to about 150 nm, and the p-type semiconductor layer may have a thickness in a range from about 100 nm to about 300 nm, for example. In one example, the light emitting element 13 may include no sapphire substrate. The n-type semiconductor layer, the light emitting layer, and the p-type semiconductor layer each may be configured of, for example but not limited to, a nitride semiconductor or the like.

The package 14 may be, for example but not limited to, a plate-shaped package (see FIGS. 1A to 9D), a package having a cavity, or the like. In one example where the plate-shaped package is used as the package 14, the light emitting element 13 may be mounted on the upper surface of the package 14, for example. In one example where the package having the cavity is used as the package 14, the light emitting element 13 may be mounted on a bottom surface of the cavity, for example. The plate-shaped package may be, for example but not limited to, a ceramic substrate. The package having the cavity may be, for example but not limited to, a resin molding which may be made of, for example but not limited to, an epoxy resin, a modified epoxy resin, a silicone resin, a modified silicone resin, an acrylate resin, an urethane resin, or the like.

The covering member 15 may be, for example but not limited to, a transmissive resin molding which may be made of, for example but not limited to, a hard silicone resin, an epoxy resin, glass, or the like. Examples of a formation method of the covering member 15 may include dripping of the hard silicone resin in a form of liquid. The covering member 15 may have any shape without limitation; however, it is preferable that the covering member 15 be formed to have a substantially semispherical shape larger than the package 14, as illustrated in FIGS. 1A to 9D. Allowing the covering member 15 to have the substantially semispherical shape larger than the package 14 makes it easier to cause light derived from the light emitting element 13 to be uniform on a surface of the covering member 15, even when the light emitting device 10 is placed on the mounting substrate 20 in an orientation different from a predetermined orientation.

Preferably, the light emitting device 10 may be unchanged in light distribution characteristic (light distribution characteristics of the light emitting device 10) between before and after rotation of the light emitting device 10 by minus 90 degrees or plus 90 degrees around a rotation axis perpendicular to a mounting surface of the light emitting device 10. In such an example, it is preferable that a light emitting surface of the light emitting element 13 mounted in the light emitting device 10 have a shape having a rotational symmetry, and more preferable that the light emitting element 13 be unchanged in light distribution characteristic (light distribution characteristics of the light emitting element 13) between before and after rotation of the light emitting element 13 by minus 90 degrees or plus 90 degrees around a rotation axis perpendicular to a mounting surface of the light emitting element 13. Using any of such light emitting devices as the light emitting device 10 makes it possible to provide the illumination device in which an occurrence of a difference in light distribution characteristic is suppressed between before and after the rotation even when the light emitting device 10 is rotated by minus 90 degrees or plus 90 degrees around the rotation axis perpendicular to the mounting surface of the light emitting device 10.

The mounting substrate 20 may include a base 23, the first wiring pattern 21, and the second wiring pattern 22. For example, the first wiring pattern 21 of the mounting substrate 20 may be a wiring pattern configured to be bonded to the n-side external electrode (one example of the first electrode 11) of the light emitting device 10, and the second wiring pattern 22 of the mounting substrate 20 may be a wiring pattern configured to be bonded to the p-side external electrode (one example of the second electrode 12) of the light emitting device 10. The first wiring pattern 21 and the second wiring pattern 22 of the mounting substrate 20 may be both provided on an upper surface of the base 23.

The base 23 is provided with conductor wiring patterns for supplying power to the light emitting device 10. The respective conductor wiring patterns are connected to the first wiring pattern 21 and the second wiring pattern 22. Examples of the base 23 may include a glass epoxy substrate, a flexible substrate, and a metal member. The glass epoxy substrate and the flexible substrate each may be formed with a conductive pattern configured of a copper foil or the like, and the metal member may be coupled with an insulating resin. The base 23 may be preferably made of a material having a thermal expansion coefficient substantially equal to that of the light emitting device 10 to allow for mitigation of an influence of a thermal stress generated between the base 23 and the light emitting device 10.

The bonding material 30 is a member configured to bond the first and second electrodes 11 and 12 of the light emitting device 10 and the first and second wiring patterns 21 and 22 of the mounting substrate 20 together, respectively. Various members may be used for the bonding material 30; however, the bonding material 30 as used herein does not encompass a wire. One example of the bonding material 30 may be a member that melts by reflow and thus acts to spread evenly over the entire surface of the corresponding electrode. The member may be, for example but not limited to, an SnPb-based solder material, an SnAgCu-based solder material, an AuSn-based solder material, an SnZn-based solder material, an SuCu-based solder material, or the like. Using such a member as the bonding material 30 allows for occurrence of a self-alignment effect on the mounting substrate 20 and the light emitting device 10, thus making it possible to achieve the illumination device having high mountability. The use of AuSn-based solder material may be preferable in terms of heat resistance and bonding reliability in one example where fixing of the light emitting device 10 is performed by reflow. The bonding material 30 may be added with an element such as, but not limited to, bismuth (Bi) and indium (In) for improving wettability or resistance to soldering crack.

The first electrode 11 and the second electrode 12 of the light emitting device 10 are bonded to the first wiring pattern 21 and the second wiring pattern 22 of the mounting substrate 20 so as to face the first wiring pattern 21 and the second wiring pattern 22, respectively, through the bonding material 30.

The first electrode 11 of the light emitting device 10 and the first wiring pattern 21 of the mounting substrate 20 may have respective shapes that bring the first electrode 11 and the first wiring pattern 21 into electric conduction with each other even when the light emitting device 10 is placed on the mounting substrate 20 in an orientation different from a predetermined orientation. Examples where the first electrode 11 of the light emitting device 10 and the first wiring pattern 21 of the mounting substrate 20 have such respective shapes may include one example in which, assuming that a figure that is rotationally symmetrical to a point P of a center of rotational symmetry is depicted, the first electrode 11 of the light emitting device 10 extends along an outer circumference of the figure and the first wiring pattern 21 of the mounting substrate 20 has a shape corresponding to the shape of the first electrode 11 of the light emitting device 10. The term "rotational symmetry" refers to a rotational symmetry rotated X times, where X is an integer of two or more. The term "figure" may refer to, for example but not limited to, a circle, an ellipse, a square, a triangle, or the like. The wording "shape corresponding to the shape of the first electrode 11" may refer to a shape completely the same as the shape of the first electrode 11, or a shape that differs from the shape of the first electrode 11 to the extent that the difference is tolerable as an error. More specific but non-limiting example may be an example in which the first electrode 11 of the light emitting device 10 has a shape rotationally symmetrical to the point P of the center of rotational symmetry, and the first wiring pattern 21 of the mounting substrate 20 has a shape corresponding to the shape of the first electrode 11 of the light emitting device 10, as illustrated in FIGS. 1A to 4D. The term "rotational symmetry" refers to the rotational symmetry rotated X times, where X is the integer of two or more, and the wording "shape corresponding to the shape of the first electrode 11" may refer to a shape completely the same as the shape of the first electrode 11, or a shape that differs from the shape of the first electrode 11 to the extent that the difference is tolerable as an error.

For example, the point P may be a point that is located on a bottom surface of the light emitting device 10 and defined according to the shape of the first electrode 11 of the light emitting device 10, and may also be a point that is located on an upper surface of the mounting substrate 20 and that corresponds to the defined point on the bottom surface of the light emitting device 10. The point P may be defined as being located inside the first electrode 11 of the light emitting device 10 as illustrated in FIGS. 1A to 2D, or may be defined as being located outside the first electrode 11 of the light emitting device 10 as illustrated in FIGS. 3A to 4D. It is to be noted that the light emitting device 10 may be rotated around the point P that serves as a rotation axis and the center of rotational symmetry in one example where the self-alignment effect is exerted.

The first electrode 11 of the light emitting device 10 and the first wiring pattern 21 of the mounting substrate 20 each may have a single region. For example, the first electrode 11 and the first wiring pattern 21 each may have an electrode shape that is uniform in layer thickness as illustrated in FIGS. 1A to 2D, or may have a doughnut-like electrode shape having a hole inside the electrode shape as illustrated in FIGS. 3A to 3D. Alternatively, the first electrode 11 and the first wiring pattern 21 each may have a plurality of regions as illustrated in FIGS. 4A to 4D. In one example where the first electrode 11 of the light emitting device 10 has the plurality of regions, the point P may be defined as being located inside one of the regions configuring the first electrode 11 of the light emitting device 10.

The second electrode 12 of the light emitting device 10 and the second wiring pattern 22 of the mounting substrate 20 may have respective shapes that bring the second electrode 12 and the second wiring pattern 22 into electric conduction with each other even when the light emitting device 10 is placed on the mounting substrate 20 in the orientation different from the predetermined orientation. Examples where the second electrode 12 of the light emitting device 10 and the second wiring pattern 22 of the mounting substrate 20 have such respective shapes may include one example in which, assuming that a figure that is rotationally symmetrical to the point P of the center of rotational symmetry is depicted, the second electrode 12 of the light emitting device 10 extends along an outer circumference of the figure and the second wiring pattern 22 of the mounting substrate 20 has a shape corresponding to the shape of the second electrode 12 of the light emitting device 10. The term "rotational symmetry" refers to a rotational symmetry rotated X times, where X is an integer of two or more. The term "figure" may refer to, for example but not limited to, a circle, an ellipse, a square, a triangle, or the like. The wording "shape corresponding to the shape of the second electrode 12" may refer to a shape completely the same as the shape of the second electrode 12, or a shape that differs from the shape of the second electrode 12 to the extent that the difference is tolerable as an error. More specific but non-limiting example may be an example in which the second electrode 12 of the light emitting device 10 has a shape rotationally symmetrical to the point P of the center of rotational symmetry, and the second wiring pattern 22 of the mounting substrate 20 has a shape corresponding to the shape of the second electrode 12 of the light emitting device 10, as illustrated in FIGS. 1A to 4D. The wording "shape corresponding to the shape of the second electrode 12" may refer to a shape completely the same as the shape of the second electrode 12, or a shape that differs from the shape of the second electrode 12 to the extent that the difference is tolerable as an error.

Definitions of the point P, electrode shapes that may be uniform in layer thickness or may be the doughnut-like electrode shape, and so forth of the second electrode 12 and the second wiring pattern 22 are the same as those of the first electrode 11 and the first wiring pattern 21. Also, the second electrode 12 and the second wiring pattern 22 each may have a single region as illustrated in FIGS. 1A to 1D and 3A to 4D, or each may have a plurality of regions as illustrated in FIGS. 2A to 2D, as with the first electrode 11 and the first wiring pattern 21.

In one example where the second electrode 12 of the light emitting device 10 and the second wiring pattern 22 of the mounting substrate 20 each have the plurality of regions, the second electrode (or the second wiring pattern 22) may have a plurality of surrounding portions 121 and 122 (or surrounding portions 221 and 222) surrounding the first electrode 11 (or the first wiring pattern 21) and each including gap regions T as illustrated in FIGS. 2A to 2D, for example. In such an example, the surrounding portions 121 and 122 (or the surrounding portions 221 and 222) may be preferably arranged so as to cover the mutual gap regions T as illustrated in FIGS. 2A to 2D. Each of such arrangements makes it easier to bring the second electrode 12 of the light emitting device 10 into electrical conduction with the second wiring pattern 22 of the mounting substrate 20 when the light emitting device 10 is rotated. Note that the "gap region T" refers to a region in which the second electrode 12 or the second wiring pattern 22 is unformed in the trajectory (a rotation region) of the second electrode 12 or the second wiring pattern 22 drawn upon the rotation of the light emitting device 10 around the point P as the center of rotation.

The light emitting device 10 is placed on the upper surface of the mounting substrate 20 so as to allow the points P defined as being located on the bottom surface of the light emitting device 10 and on the upper surface of the mounting substrate 20 to be brought into coincidence with each other.

The term "coincidence" encompasses complete coincidence of the points P as well as a shift in a horizontal direction, a vertical direction, or both to the extent the shift is tolerable as an error as illustrated in FIGS. 1A to 4D. Even when the light emitting device 10 is placed on the mounting substrate 20 in an orientation different from a predetermined orientation in the above-described placement of the light emitting device 10, it is possible for the first embodiment to ensure that the electrodes (the first electrode 11 and the second electrode 12) of the light emitting device 10 and the wiring patterns (the first wiring pattern 21 and the second wiring pattern 22) of the mounting substrate 20 are bonded to one another.

In the illumination device 100 according to the above-described first embodiment, the second electrode 12 and the second wiring pattern 22 are configured to be at least partially overlapped with each other in a plan view irrespective of an orientation of the light emitting device 10, under condition that the first electrode 11 and the first wiring pattern 21 are at least partially overlapped with each other in the plan view. The illumination device 100 according to the first embodiment thus makes it possible to bond the electrodes (the first electrode 11 and the second electrode 12) of the light emitting device 10 and the wiring patterns (the first wiring pattern 21 and the second wiring pattern 22) of the mounting substrate 20 together irrespective of an orientation in which the light emitting device 10 is placed. Hence, it is possible to suppress a decrease in yield attributed to a bonding failure, and thereby to improve productivity in manufacturing the illumination device.

Figure 5A:
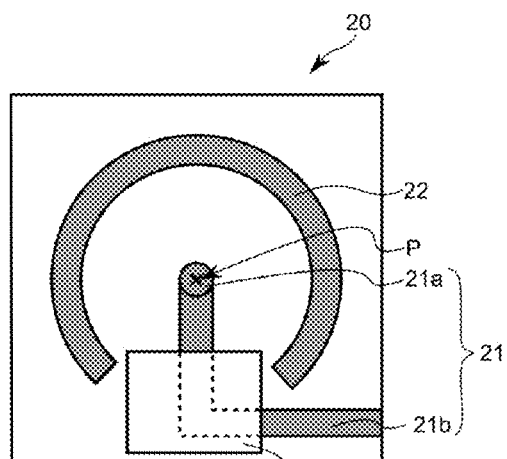
Figure 5B:
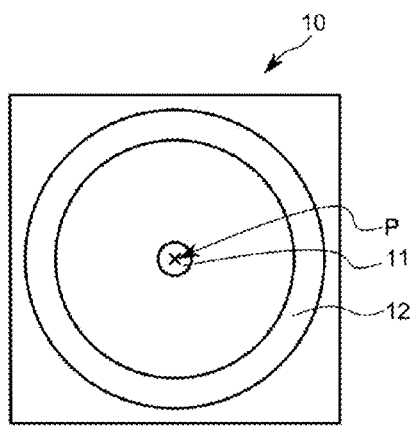
Figure 5C:
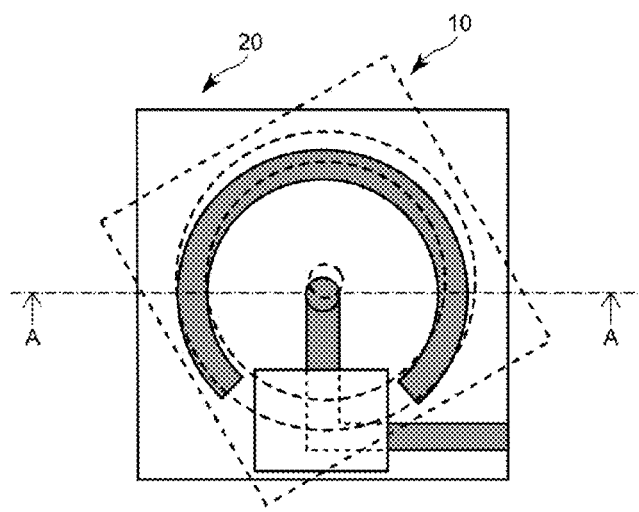
Figure 5D:
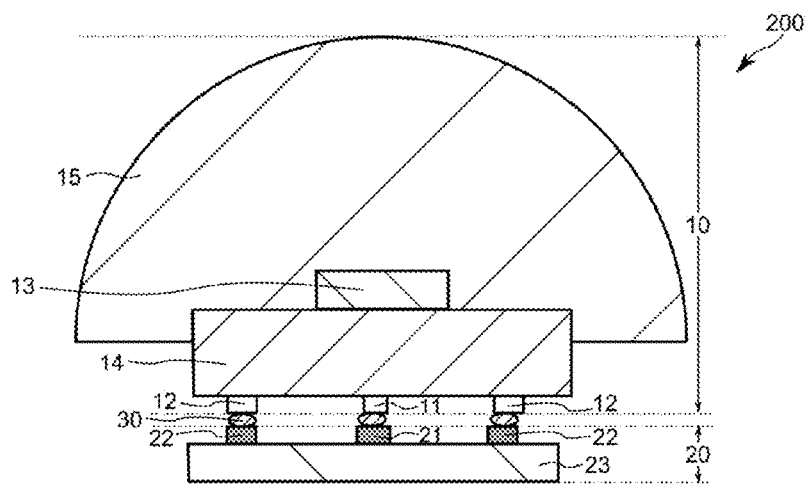

FIGS. 5A to 5D are schematic views for describing an illumination device according to a second embodiment. FIG. 5A is a top view of the mounting substrate. FIG. 5B is a bottom view of the light emitting device. FIG. 5C is a plan view, in which the light emitting device is placed on the mounting substrate, and the mounting substrate and the light emitting device are denoted by a solid line and a broken line, respectively. FIG. 5D is a cross-sectional view taken along a line A-A in FIG. 5C.

Referring to FIGS. 5A to 5D, an illumination device 200 according to the second embodiment differs from the illumination device 100 according to the first embodiment, in that the second wiring pattern 22 has a shape corresponding to a shape obtained by providing an opening in the shape of the shape of the second electrode 12. The second illumination device 200 also differs from the illumination device 100 in that the first wiring pattern 21 includes a main portion 21a and an attaching portion 21b, in which the main portion 21a has a shape corresponding to the shape of the first electrode 11, and the attaching portion 21b extends from the main portion 21a to pass through the opening. The wording "shape corresponding to the second electrode 12" may refer to a shape completely the same as the shape of the second electrode 12, or a shape that differs from the shape of the second electrode 12 to the extent that the difference is tolerable as an error. It is to be noted that a shape without the opening is the shape corresponding to the shape of the second electrode 12 of the light emitting device 10. The term "extend" refers to extension of the attaching portion 21b from the main portion 21a toward the opening.

In the illumination device 200 according to the second embodiment, it is possible to perform supply of power to the first wiring pattern 21 of the mounting substrate 20 easily from any position on the upper surface of the mounting substrate 20. Hence, it is possible to supply power to the first wiring pattern 21 of the mounting substrate 20 easily even in an example case where a member such as a heat sink is provided on the back side of the mounting substrate 20 and thereby no space for supplying power is available on the back side.

Note that the mounting substrate 20 may include an insulating member 40 that covers the attaching portion 21b of the first wiring pattern 21 in the opening of the second wiring pattern 22 to prevent occurrence of short-circuit between the light emitting device 10 and the mounting substrate 20. Here, providing the insulating member 40 at least on a surface of the attaching portion 21b to prevent occurrence of short-circuit between the light emitting device 10 and the mounting substrate 20 is sufficient to satisfy the meaning of the term "cover" as used herein; hence, the insulating member 40 may or may not have a shape that conforms with a shape of the opening. Examples of a material of the insulating member 40 may include: a thermoplastic resin which may be, for example but not limited to, a polyphthalamide resin; a thermosetting resin which may be, for example but not limited to, an epoxy resin; glass epoxy; and ceramic.

Figure 6A:
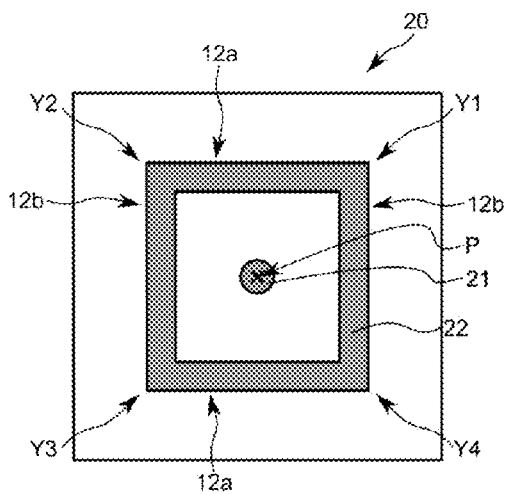
Figure 6B:
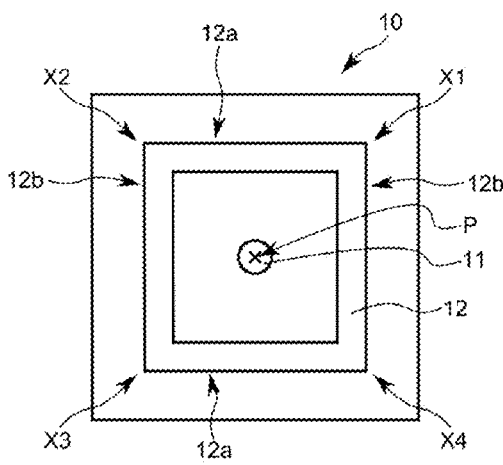
Figure 6C:
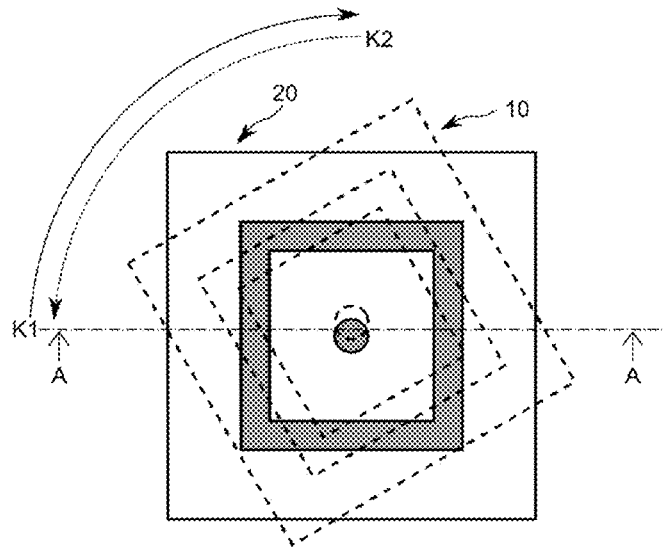
Figure 6D:
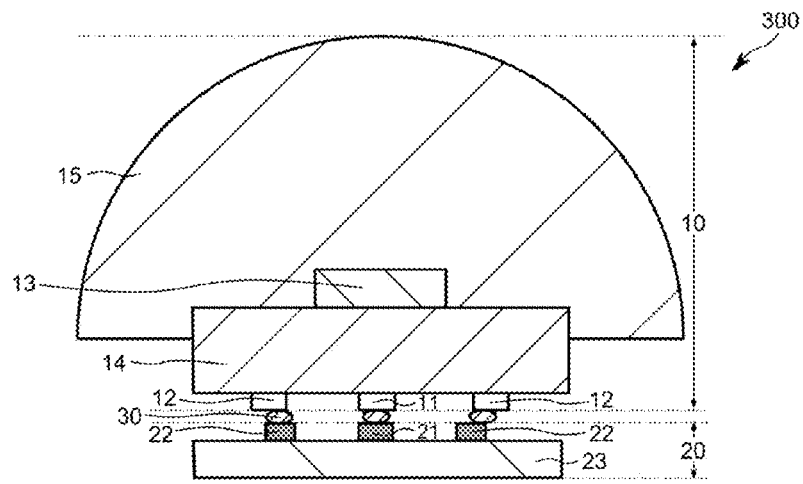

FIGS. 6A to 6D are schematic views for describing an illumination device according to a third embodiment. FIG. 6A is a top view of the mounting substrate. FIG. 6B is a bottom view of the light emitting device. FIG. 6C is a plan view, in which the light emitting device is placed on the mounting substrate, and the mounting substrate and the light emitting device are denoted by a solid line and a broken line, respectively. FIG. 6D is a cross-sectional view taken along a line A-A in FIG. 6C.

Referring to FIGS. 6A to 6D, an illumination device 300 according to the third embodiment differs from the illumination device 100 according to the first embodiment, in that the second electrode 12 of the light emitting device 10 and the second wiring pattern 22 of the mounting substrate 20 each include two sides 12a and 12b along respective two directions that intersect each other. As will be described later in detail, the self-alignment effect causes the light emitting device 10 to be moved in the horizontal direction, the vertical direction, or both or rotated clockwise or anticlockwise in a plan view, until surface tension of the bonding material 30 is balanced. A situation where the surface tension of the bonding material 30 comes into balance, in other words, is a situation where the first and second electrodes 11 and 12 of the light emitting device 10 and the first and second wiring patterns 21 and 22 of the mounting substrate 20 are brought into coincidence with each other. In this regard, in the illumination device 300 according to the third embodiment, the surface tension of the bonding material 30 comes into balance and hence the first and second electrodes 11 and 12 and the first and second wiring patterns 21 and 22 are brought into coincidence with each other only when the light emitting device 10 is in one of the following orientations (1) to (4) in which:

(1) points X1, X2, X3, and X4 overlap with points Y1, Y2, Y3, and Y4, respectively;
(2) the points X1, X2, X3, and X4 overlap with the points Y2, Y3, Y4, and Y1, respectively;
(3) the points X1, X2, X3, and X4 overlap with the points Y3, Y4, Y1, and Y2, respectively; and
(4) the points X1, X2, X3, and X4 overlap with the points Y4, Y1, Y2, and Y3, respectively. Hence, the bonding material 30 may be a member configured to cause the self-alignment effect in the illumination device 300 according to the third embodiment. The use of the member that causes the self-alignment effect as the bonding material 30 makes it possible to rotate the light emitting device 10 clockwise (i.e., in a direction denoted by "K1") or anticlockwise (i.e., in a direction denoted by "K2") to direct the light emitting device 10 in one of the four orientations (1) to (4). It is to be noted that the light emitting device 10 is placed on the mounting substrate 20 in an orientation different from a predetermined orientation at a position slightly shifted in the horizontal and vertical directions from a predetermined position in one example illustrated in FIGS. 6A to 6D. Hence, following the placement of the light emitting device 10 onto the mounting substrate 20, the light emitting device 10 is rotated clockwise (i.e., in the direction denoted by "K1") or anticlockwise (i.e., in the direction denoted by "K2") and is also moved slightly in the horizontal direction, the vertical direction, or both.

Examples where the second electrode 12 of the light emitting device 10 and the second wiring pattern 22 of the mounting substrate 20 each include the two sides 12a and 12b along the respective two directions that intersect each other may include one example in which the second electrode 12 of the light emitting device 10 has a shape having n-number of angles, where "n" is an integer of three or more. The "sides along respective two directions that intersect each other" of the second electrode 12 each refer to a line segment (a straight line) that connects a vertex and a vertex of the second electrode 12. FIGS. 6A and 6B each illustrate one example in which a line segment 12a connecting the points X1 and X2, a line segment 12b connecting the points X2 and X3, a line segment 12a connecting the points X3 and X4, and a line segment 12b connecting the points X4 and X1 correspond to the sides along respective two directions that intersect each other, as well as a line segment 12a connecting the points Y1 and Y2, a line segment 12b connecting the points Y2 and Y3, a line segment 12a connecting the points Y3 and Y4, and a line segment 12b connecting the points Y4 and Y1 correspond to the sides along respective two directions that intersect each other.

Figure 7A:
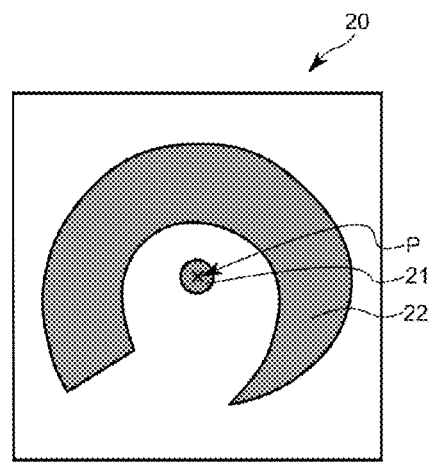
Figure 7B:
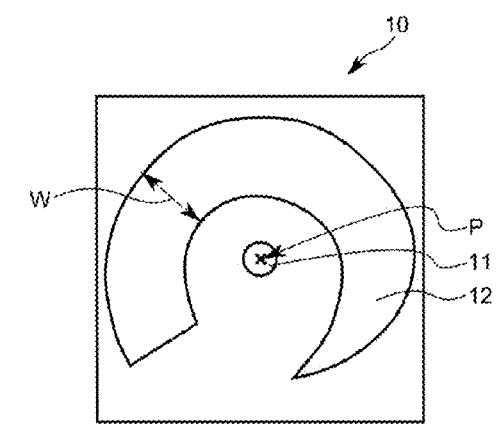
Figure 7C:
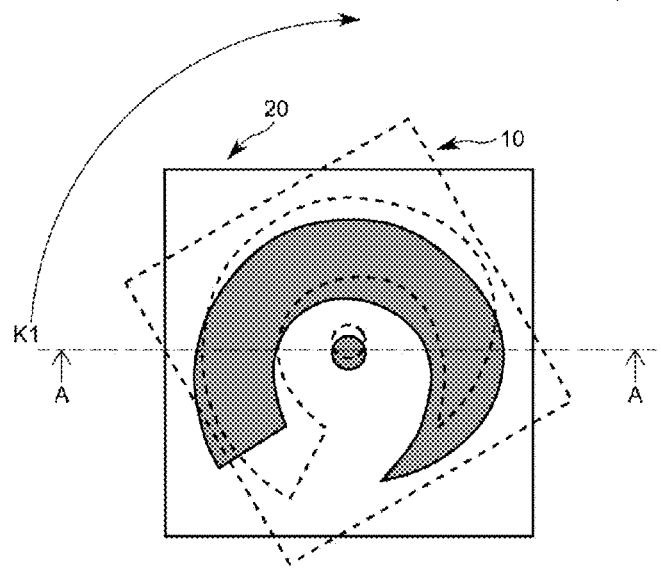
Figure 7D:
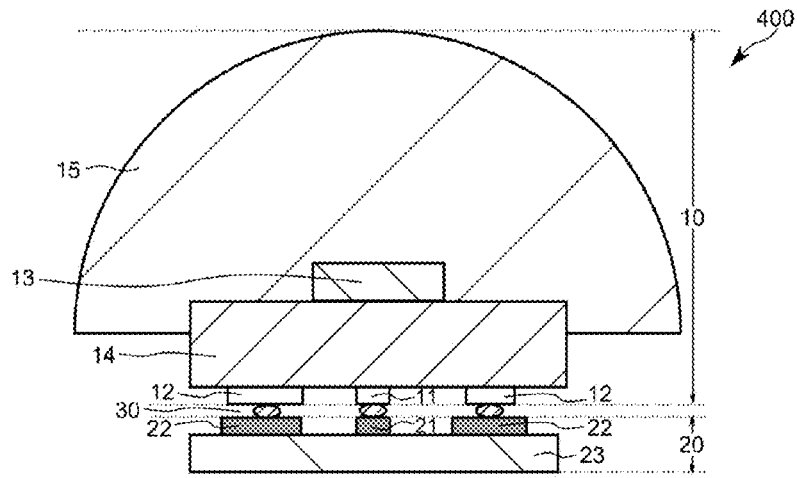
Figure 8A:
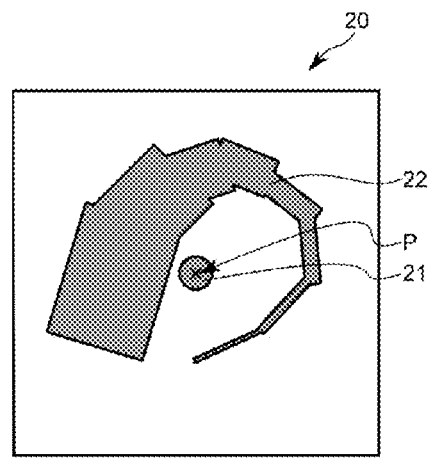
Figure 8B:
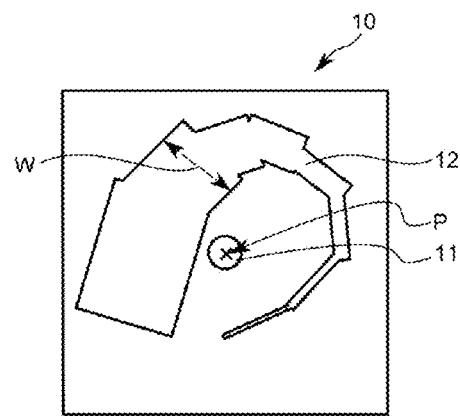
Figure 8C:
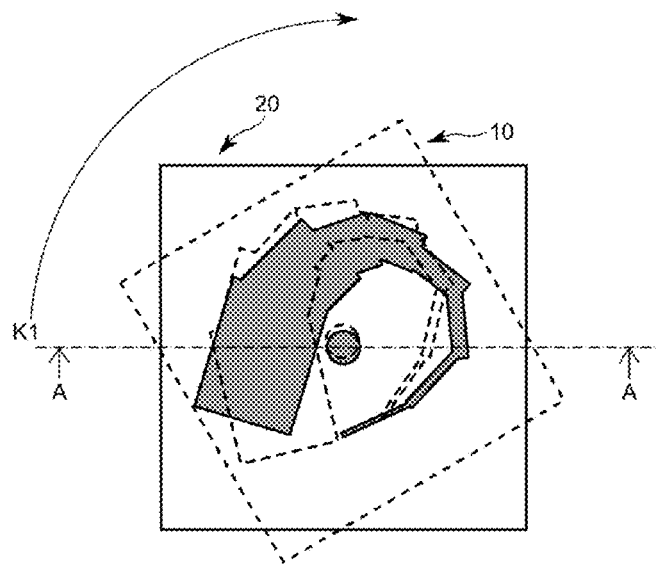
Figure 8D:
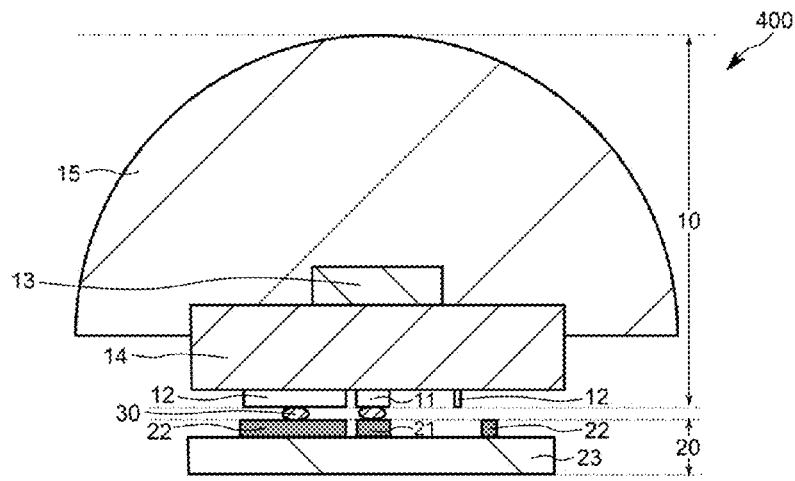
Figure 9A:
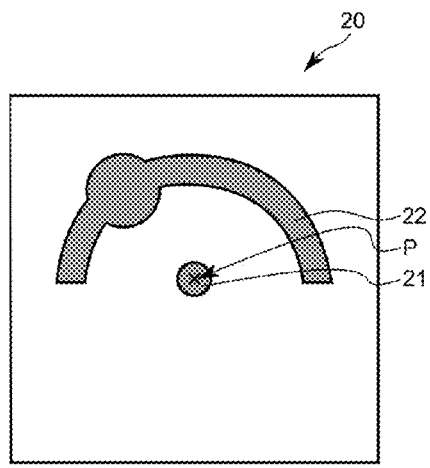
Figure 9B:
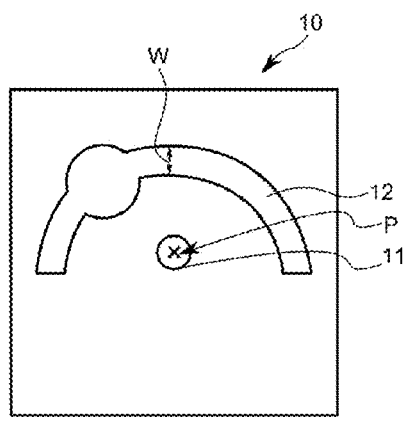
Figure 9C:
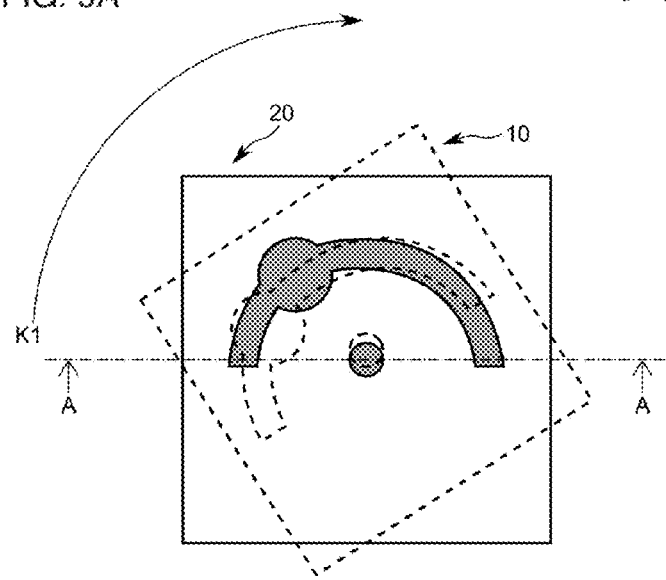
Figure 9D:
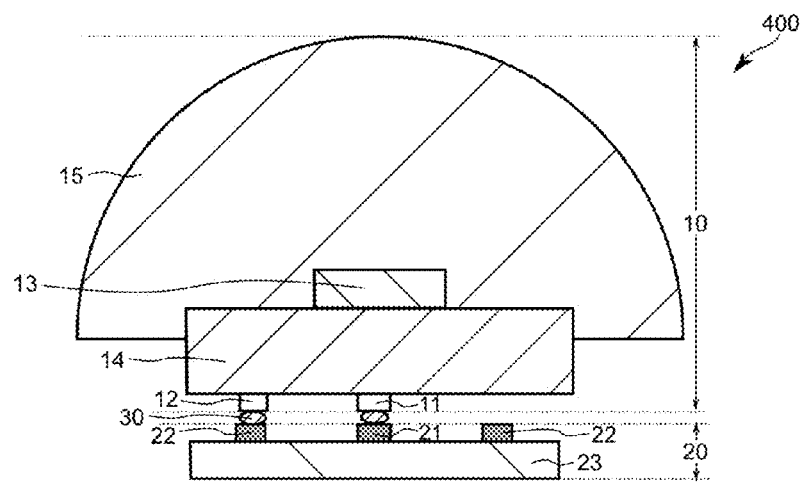

FIGS. 7A to 9D are schematic views for describing an illumination device according to a fourth embodiment. FIGS. 7A, 8A, and 9A are each a top view of the mounting substrate. FIGS. 7B, 8B, and 9B are each a bottom view of the light emitting device. FIGS. 7C, 8C, and 9C are each a plan view, in which the light emitting device is placed on the mounting substrate, and the mounting substrate and the light emitting device are denoted by a solid line and a broken line, respectively. FIGS. 7D, 8D, and 9D are cross-sectional views taken along respective lines A-A in FIGS. 7C, 8C, and 9C.

Referring to FIGS. 7A to 9D, an illumination device 400 according to the fourth embodiment differs from the illumination device 300 whose second electrode 12 has an uniform width W according to the third embodiment, in that the second electrode 12 of the light emitting device 10 has a non-uniform width W, and the second wiring pattern 22 of the mounting substrate 20 has a shape corresponding to the shape of the second electrode 12 of the light emitting device 10. The wording "shape corresponding to the shape of the second electrode 12" may refer to a shape completely the same as the shape of the second electrode 12, or a shape that differs from the shape of the second electrode 12 to the extent that the difference is tolerable as an error. The uniform width W of the second electrode 12 makes it easier to bring the electrodes of the light emitting device 10 and the wiring patterns of the mounting substrate 20 to be brought into coincidence with each other and thus to bring them into electrical conduction with each other easily, and the non-uniform width W of the second electrode 12, in addition thereto, allows for improvement in design of the illumination device. More specifically, in the illumination device 300 according to the third embodiment, the first and second electrodes 11 and 12 of the light emitting device 10 and the first and second wiring patterns 21 and 22 of the mounting substrate 20 are brought into coincidence with each other only when the light emitting device 10 is in one of the orientations (1) to (4) as described above. On the other hand, in the illumination device 400 according to the fourth embodiment, the width W of the second electrode 12 is non-uniform, eliminating the symmetry in the horizontal direction, the vertical direction, or both or the rotational symmetry in the plan view of the second electrode 12 of the light emitting device 10 and thus allowing the light emitting device 10 to be moved or rotated unilaterally toward a region in which an amount of solder is large. As a result, the second electrode 12 of the light emitting device 10 and the second wiring pattern 22 of the mounting substrate 20 are allowed to be brought into coincidence with each other based only on a single pattern of orientation of the light emitting device 10. Hence, in the illumination device 400 according to the fourth embodiment, the self-alignment effect acts so as to move or rotate the light emitting device 10 only in one direction, making it possible not only to align each of the light emitting devices 10 in the same direction but also to direct those light emitting devices 10 in the same orientation, in an example case where the plurality of light emitting devices 10 are to be mounted on the single mounting substrate 20, and thereby to improve design of the illumination device.

The wording "non-uniform width W of the second electrode 12" of the light emitting device 10 may refer to non-limiting examples where the width W becomes large gradually as illustrated in FIGS. 7A to 7D, where the width W becomes large in a stepwise fashion as illustrated in FIGS. 8A to 8D, and where the width W becomes large locally as illustrated in FIGS. 9A to 9D. It is to be noted that, in one example where the width W becomes large in a stepwise fashion as illustrated in FIGS. 8A to 8D, force that acts to balance the surface tension is applied stepwise to the solder rather than being applied at a time to the solder. Hence, the respective shapes of the second electrode 12 of the light emitting device 10 and the second wiring pattern 22 of the mounting substrate 20 themselves serve as guides for moving or rotating the light emitting device 10, making it easier to bring the first and second electrodes 11 and 12 of the light emitting device 10 and the first and second wiring patterns 21 and 22 of the mounting substrate 20 to be brought into coincidence with each other.

Figure 10A:
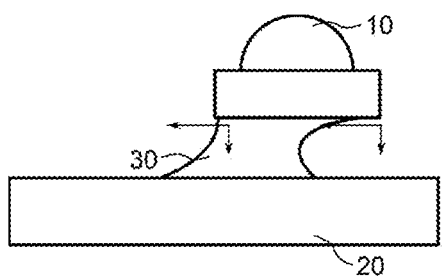
Figure 10B:
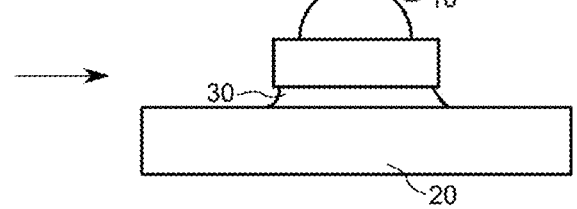

FIGS. 10A and 10B describe a principle of the self-alignment effect, wherein FIG. 10(A) illustrates an example of a state before the self-alignment effect is exerted, and FIG. 10(B) illustrates an example of a state after the self-alignment effect is exerted.

The self-alignment effect refers to a phenomenon, by means of the reflow, that causes the light emitting device 10 to be moved in the horizontal direction, the vertical direction, or both or rotated clockwise or anticlockwise in a plan view, until the surface tension of the melted bonding material 30 is balanced. The balance in the surface tension of the melted bonding material 30 is equal to the coincidence of the first and second electrodes 11 and 12 of the light emitting device 10 with the first and second wiring patterns 21 and 22 of the mounting substrate 20. Hence, even if there is a shift in a positional relationship between the light emitting device 10 and the mounting substrate 20 upon the placement of the light emitting device 10 on the mounting substrate 20 as illustrated in FIG. 10(A), the self-alignment effect allows for easy recovery of the shifted positional relationship to a proper positional relationship thereafter as illustrated in FIG. 10(B). It is to be noted that, even when the recovery in the positional relationship by the self-alignment effect is insufficient or unavailable, it is still possible to bring the electrodes of the light emitting device 10 into electrical conduction with the wiring patterns of the mounting substrate 20 as described above, according to each of the first embodiment to the fourth embodiment.

Although a description is given of some example embodiments, the description is directed to illustrative examples and is thus non-limiting. Elements recited in the following claims are by no means limited to the description given above.

What is claimed is:

1. An illumination device, comprising:
   a light emitting device having a first electrode, a second electrode, a light emitting element, and a package, wherein the light emitting element is mounted on the package; and
   a mounting substrate including a first wiring pattern and a second wiring pattern, the first wiring pattern and the second wiring pattern facing and being bonded to the first electrode and the second electrode, respectively, through a bonding material,
   wherein the second electrode and the second wiring pattern are configured to be at least partially overlapped with each other in a plan view irrespective of an orientation of the light emitting device, under condition that the first electrode and the first wiring pattern are at least partially overlapped with each other in the plan view,
   wherein the first electrode and the second electrode are disposed on a mounting surface side of the package,
   wherein the mounting substrate is disposed on the same side as the mounting surface side of the package,
   wherein the second electrode has a shape rotationally symmetrical to a point of a center of rotational symmetry located inside the first electrode, or located outside and surrounded by the first electrode, and
   wherein the second wiring pattern has a shape corresponding to a shape of the second electrode.

2. The illumination device according to claim 1, wherein the first electrode has a rotationally symmetrical shape, and
   the first wiring pattern has a shape corresponding to the shape of the first electrode.

3. An illumination device, comprising:
   a light emitting device having a first electrode and a second electrode; and
   a mounting substrate including a first wiring pattern and a second wiring pattern, the first wiring pattern and the second wiring pattern facing and being bonded to the first electrode and the second electrode, respectively, through a bonding material,
   wherein the second electrode and the second wiring pattern are configured to be at least partially overlapped with each other in a plan view irrespective of an orientation of the light emitting device, under condition that the first electrode and the first wiring pattern are at least partially overlapped with each other in the plan view,
   wherein the second electrode has a shape rotationally symmetrical to a point of a center of rotational symmetry located inside the first electrode, or located outside and surrounded by the first electrode, and
   wherein the second wiring pattern has a shape corresponding to a shape obtained by providing an opening in the shape of the second electrode, the first wiring pattern includes a main portion and an attaching portion, the main portion having a shape corresponding to the shape of the first electrode, and the attaching portion extending from the main portion to pass through the opening, and the mounting substrate further includes an insulating member that covers the attaching portion of the first wiring pattern in the opening.

4. The illumination device according to claim 1, wherein the bonding material comprises a member configured to cause a self-alignment effect by reflow.

5. The illumination device according to claim 4, wherein the second electrode includes two sides along respective two directions that intersect each other, and the second wiring pattern has a shape corresponding to a shape of the second electrode.

6. The illumination device according to claim 4, wherein the second electrode has a non-uniform width, and the second wiring pattern has a shape corresponding to a shape of the second electrode.

7. The illumination device according to claim 1, wherein the light emitting device is configured to be unchanged in light distribution characteristic between before and after rotation of the light emitting device by one of minus 90 degrees and plus 90 degrees around a rotation axis perpendicular to a mounting surface of the light emitting device.

8. The illumination device according to claim 4, wherein the bonding material comprises an SnPb-based solder material, an SnAgCu-based solder material, an AuSn-based solder material, an SnZn-based solder material or an SuCu-based solder material.

9. The illumination device according to claim 1, wherein the light emitting device is a surface mount type device.

10. The illumination device according to claim 1, wherein a covering member of the light emitting device is a same size or larger than a package of the light emitting device in plan view.

11. The illumination device according to claim 1, wherein a light emitting surface of a light emitting element mounted in the light emitting device has a shape having a rotational symmetry.

12. The illumination device according to claim 1, wherein the mounting substrate comprising a material having a thermal expansion coefficient substantially equal to that of the light emitting device.

13. The illumination device according to claim 1, wherein a shape of the first electrode or the first wiring pattern has a doughnut-like electrode shape having a hole inside the electrode shape.

14. The illumination device according to claim 1, wherein a shape of the first electrode or the first wiring pattern has two or more regions.

15. An illumination device, comprising:

a light emitting device comprising a first electrode, a second electrode, a light emitting element, and a package, wherein the light emitting element is mounted on the package, and the second electrode having a rotationally symmetrical shape around a point, which is a center of rotation and located inside the first electrode, or located outside and surrounded by the first electrode; and a mounting substrate comprising a first wiring pattern, and a second wiring pattern having a rotationally symmetrical shape around a point, which is a center of rotation and located inside the first wiring pattern, or located outside and surrounded by the first wiring pattern, wherein the first wiring pattern and the second wiring pattern facing and being electrically connected to the first electrode and the second electrode, respectively, through a bonding material, wherein the first electrode and the second electrode are disposed on a mounting surface side of the package, and wherein the mounting substrate is disposed on the same side as the mounting surface side of the package.

16. The illumination device according to claim 15, wherein the second electrode has a shape rotationally symmetrical to a point of a center of rotational symmetry located inside the first electrode, or located outside and surrounded by the first electrode.

17. The illumination device according to claim 15, wherein the second wiring pattern has a shape corresponding to a shape of the second electrode.

18. The illumination device according to claim 15, wherein the first electrode has a rotationally symmetrical shape, and the first wiring pattern has a shape corresponding to the shape of the first electrode.

* * * * *